(12) United States Patent
Chu et al.

(10) Patent No.: US 10,860,477 B2
(45) Date of Patent: Dec. 8, 2020

(54) APPARATUS AND METHOD FOR LOW POWER LOW LATENCY HIGH CAPACITY STORAGE CLASS MEMORY

(71) Applicant: Western Digital Technologies, Inc., San Jose, CA (US)

(72) Inventors: Frank R. Chu, Milpitas, CA (US); Luiz M. Franca-Neto, Sunnyvale, CA (US); Timothy K. Tsai, Santa Clara, CA (US); Qingbo Wang, Irvine, CA (US)

(73) Assignee: WESTERN DIGITAL TECNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/716,467

(22) Filed: Sep. 26, 2017

(65) Prior Publication Data
US 2018/0018259 A1  Jan. 18, 2018

Related U.S. Application Data

(63) Continuation of application No. 13/647,273, filed on Oct. 8, 2012, now abandoned.

(51) Int. Cl.
*G06F 12/06* (2006.01)
*G11C 11/00* (2006.01)
*G06F 12/02* (2006.01)

(52) U.S. Cl.
CPC .......... *G06F 12/06* (2013.01); *G06F 12/0223* (2013.01); *G06F 12/0238* (2013.01);
(Continued)

(58) Field of Classification Search
None
See application file for complete search history.

(56) References Cited

U.S. PATENT DOCUMENTS 5,956,743 A * 9/1999 Bruce .................. G06F 11/1068
711/103
6,336,174 B1  1/2002 Li et al.
(Continued)

FOREIGN PATENT DOCUMENTS

GB  2507410 A  4/2014
JP  2009540431 A  11/2009
(Continued)

OTHER PUBLICATIONS

Shainer, G., Why Compromise?, HPCwire, 2006, retrieved from https://web.archive.org/web/20090722111255/http://www.hpcwire.com/features/17888274.html on Jul. 2, 2019, 13 pages (Year: 2006).*
(Continued)

*Primary Examiner* — Gary W. Cygiel
(74) *Attorney, Agent, or Firm* — Patterson & Sheridan, LLP; Steven H. Versteeg

(57) ABSTRACT

A method and a storage system are provided for implementing enhanced solid state storage class memory (eSCM) including a direct attached dual in line memory (DIMM) card containing Dynamic Random Access Memory (DRAM), and at least one 5 non-volatile memory, for example, Phase Change Memory (PCM), Resistive RAM (ReRAM), Spin-Transfer-Torque RAM (STT-RAM), and NAND Flash chips. An eSCM processor controls selectively allocating data among the DRAM, and the at least one non-volatile memory primarily based upon a data set size.

7 Claims, 10 Drawing Sheets

(52) U.S. Cl.
CPC ...... *G11C 11/005* (2013.01); *G06F 2212/205* (2013.01); *G06F 2212/2022* (2013.01); *G06F 2212/2024* (2013.01); *Y02D 10/00* (2018.01)

(56) References Cited

U.S. PATENT DOCUMENTS

| | | | |
|---|---|---|---|
| 7,237,133 | B2 | 6/2007 | Aoki |
| 7,716,411 | B2 | 5/2010 | Panabaker et al. |
| 7,802,034 | B2 * | 9/2010 | Liu ..................... G06F 13/385 710/62 |
| 8,397,013 | B1 | 3/2013 | Rosenband et al. |
| 2007/0288683 | A1 | 12/2007 | Panabaker et al. |
| 2008/0126716 | A1 | 5/2008 | Daniels |
| 2009/0248965 | A1 | 10/2009 | Lee et al. |
| 2009/0254705 | A1 | 10/2009 | Abali et al. |
| 2010/0180068 | A1 | 7/2010 | Matsumoto et al. |
| 2011/0035540 | A1 | 2/2011 | Fitzgerald et al. |
| 2011/0167197 | A1 | 7/2011 | Leinwander |
| 2012/0137055 | A1 | 5/2012 | Lee et al. |
| 2012/0191900 | A1 | 7/2012 | Kunimatsu et al. |
| 2013/0275682 | A1 | 10/2013 | Ramanujan et al. |

FOREIGN PATENT DOCUMENTS

| | | |
|---|---|---|
| JP | 2008/018258 A1 | 12/2009 |
| JP | 2011-186563 A | 9/2011 |
| JP | 2011258229 A | 12/2011 |
| WO | 2008018258 A1 | 2/2008 |
| WO | 2013165386 A1 | 11/2013 |

OTHER PUBLICATIONS

Office Action issued in Japanese corresponding Japanese Patent Application No. 2013-211145, dated Apr. 17, 2015 (17 pages).

* cited by examiner

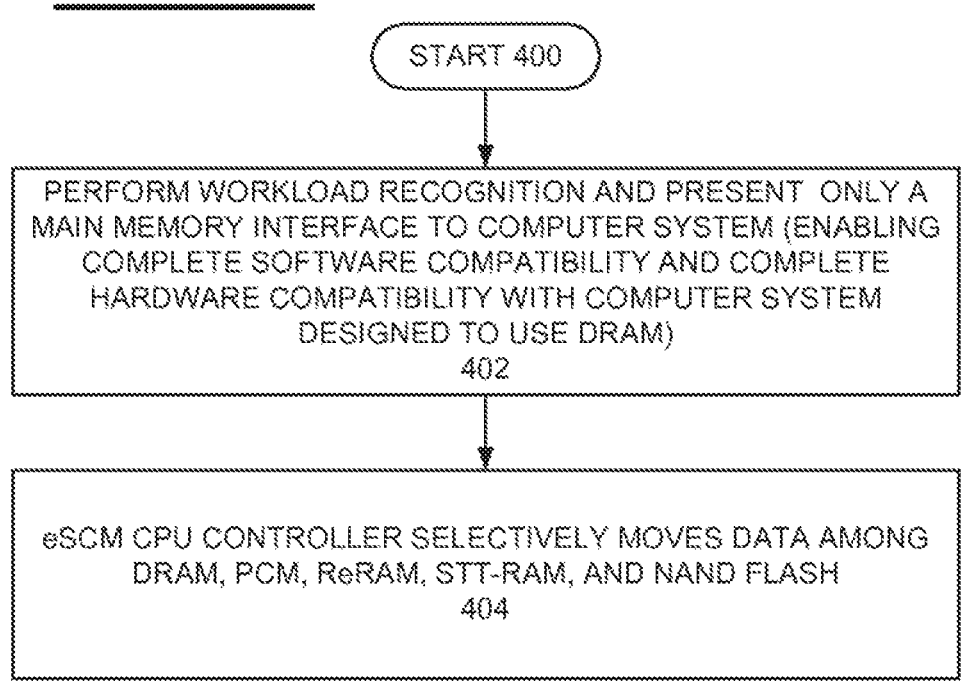

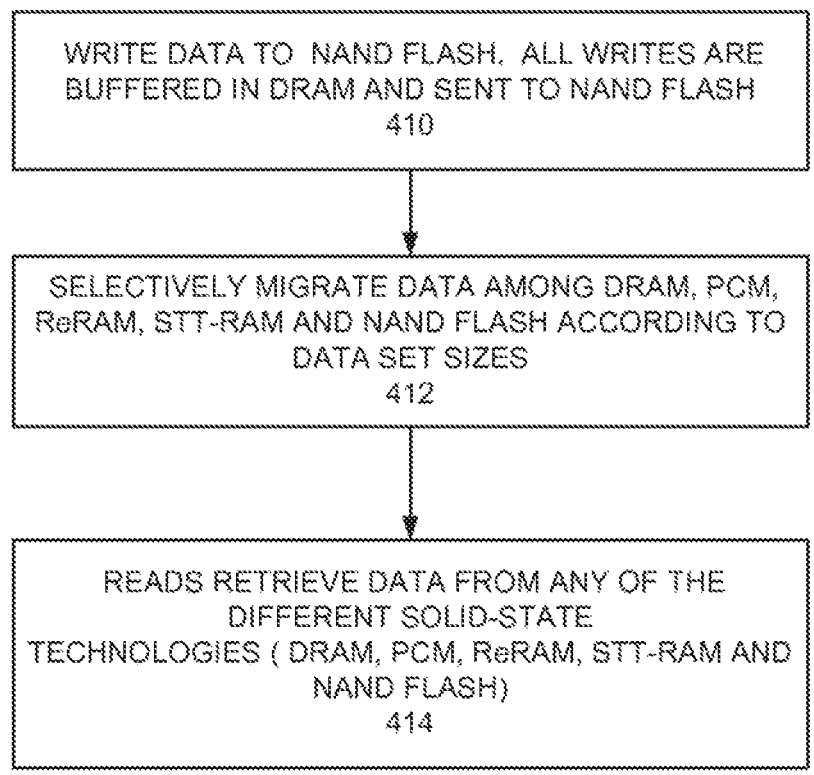

– 1 –

APPARATUS AND METHOD FOR LOW POWER LOW LATENCY HIGH CAPACITY STORAGE CLASS MEMORY

CROSS-REFERENCE TO RELATED APPLICATIONS

This application is a continuation application of co-pending U.S. patent application Ser. No. 13/647,273, filed on Oct. 8, 2012, which is incorporated herein by reference.

BACKGROUND

Field of the Invention

The present invention relates generally to the data storage field, and more particularly, relates to a method and a storage system for implementing storage class memory with large size, low power and low latency in data accesses. This storage class memory can be attached directly to the memory bus or to peripheral interfaces in computer systems such as peripheral component interconnect (PCI), or PCIe or common storage interfaces such as Serial (ATA) or SATA, or Serial Attached SCSI (SAS).

Description of the Related Art

Non-volatile solid state memory technologies, such as NAND Flash, have been used for data storage in computer systems. Solid State Drives (SSDs) used in computer systems can take both the form factors and interfaces of hard disk drives (HDDs). SSDs nevertheless provide for faster data access solution than HDDs. SSDs have recently evolved to provide alternative form factor and access through a PCIe interface. In the interest of providing even faster access to stored data, it has been proposed to use direct attachment to the memory bus in a computer system for those solid state storage solutions.

On the memory bus in computer systems, due to the performance requirement in bandwidth and low latency, volatile dynamic random access memory (DRAM) is typically used. Moreover, since data in memory is frequently accessed, non-volatile memory technologies might be exposed to early failure given the relatively low endurance of current non-volatile solid state technology.

Recently, given the significant gap in bandwidth and latency between memory and storage in computer systems, a new hierarchy called Storage Class Memory (SCM) has been proposed. A SCM would have attributes of low latency and high bandwidth closer to memory requirements than common storage hierarchy, and SCM would have also the attribute of non-volatility associated with storage technologies.

Unfortunately, the Storage Class Memory concept has found only partial realization. In some instances, SCM is basically a typical NAND Flash-based solid state storage where some improvements were gained at latency in data access. In other realization, SCM is mostly a memory solution where non-volatility was added to the realization. In this latter case, capacity of the SCM was compromised or the SCM cost became relatively unattractive.

An aspect of the present invention is to provide an apparatus and method for a Storage Class Memory (SCM) that provides low power, high performance, low latency and non-volatility, without sacrificing capacity thus realizing the required attributes for a SCM.

SUMMARY

Aspects of the present invention are to provide a method and a storage system for implementing enhanced solid-state storage usage. Other important aspects of the present invention are to provide such method and storage system substantially without negative effect and to overcome some of the disadvantages of prior art arrangements.

In brief, a method and a storage system are provided for implementing enhanced solid-state storage class memory (eSCM) including a direct attached dual in line memory (DIMM) card containing dynamic random access memory (DRAM), and at least one non-volatile memory, for example, Phase Change Memory (PCM), Resistive RAM (ReRAM), Spin-Transfer-Torque RAM (STT-RAM), and NAND Flash chips. An eSCM processor controls selectively moving data among the DRAM, and the at least one non-volatile memory based upon a data set size.

BRIEF DESCRIPTION OF THE DRAWINGS

The present invention together with the above and other objects and advantages may best be understood from the following detailed description of the embodiments of the invention illustrated in the drawings, wherein:

FIGS. 4A, 4B, 4C are flow charts illustrating example operations of the enhanced solid-state Storage Class Memory of FIG. 1 for implementing enhanced solid state storage usage performance in accordance with embodiments of the invention;

DETAILED DESCRIPTION

Figure 1:
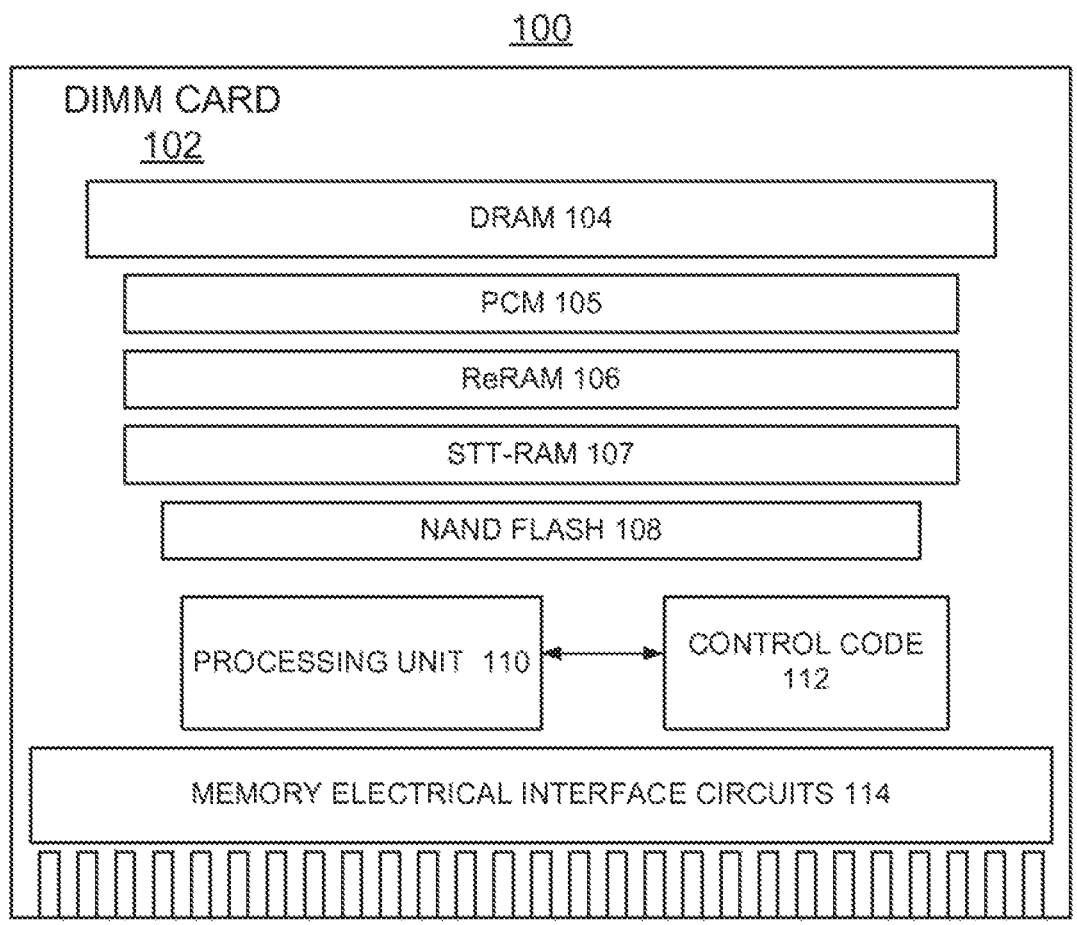
FIG. 1 is a block diagram representation of an enhanced solid-state storage class memory (eSCM) for implementing enhanced solid-state storage performance in accordance with an embodiment of the invention.

In many computer systems main memory typically includes dynamic random access memory (DRAM). DRAM is generally expensive and has generally high power dissipation resulting from required memory refreshing.

A need exists for an effective and efficient method and a storage system for implementing enhanced solid-state storage performance including a low cost, low power and high capacity storage system.

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the embodiments of the invention, a method and a storage system are provided for implementing an enhanced solid-state Storage Class Memory including a direct attached dual in line memory (DIMM) card containing dynamic random access memory (DRAM), and at least one non-volatile memory, such as Phase Change Memory (PCM), Resistive RAM (ReRAM), Spin-Transfer-Torque RAM (STT-RAM), and NAND Flash chips.

The apparatus and method for a low power low latency high capacity enhanced Storage Class Memory disclosed in one embodiment uses the direct attached dual in line memory (DIMM) card containing a multiplicity of solid state memory technologies and a method to manage storage data with the objective of providing data protection against power disruption, low power operation and low latency in data access. In such enhanced storage class memory, for illustration only Dynamic Random Access Memory (DRAM), Phase Change Memory (PCM), Resistive RAM (ReRAM), Spin-Transfer-Torque RAM (STT-RAM), and NAND Flash chips provide an example of implementation. Those skilled in the art will readily find variations on the example using different memory technologies without departing from the spirit of this invention.

In another embodiment, the enhanced Storage Class Memory may use other interfaces to the computer system different from those used above in the illustration of an eSCM used in direct attachment to the memory bus.

Different solid state memory technologies offer different benefits for the final eSCM solution. The eSCM embodiments of the present invention exploit in a hybrid arrangement those different technologies to improve the final solution. In one illustrative embodiment, large capacity and low cost are achieved by using NAND Flash. Other solid state memory technologies like Phase Change Memory are added to the hybrid solution to provide low latency access and non-volatility. Very frequently overwriting of data is supported by substantial presence of DRAM in the eSCM.

Low power is achieved by the non-volatility attribute of the eSCM disclosed, since relative to a purely DRAM solution there is no need to refresh data in the non-DRAM SCM memory cells.

Low latency is achieved by a specific algorithm in the eSCM by distributing data among the different solid state technologies according to data set size committed to the memory. This is a dynamic strategy that takes advantage of statistics of the eSCM data traffic.

Those skilled in the art will recognize that this dynamic strategy of the present invention provided by such method and storage system achieves low latency objectives substantially without negative effect and that overcomes some of the disadvantages of prior art arrangements.

In accordance with features of the embodiments of the invention, a method and a storage system are provided for implementing an enhanced solid-state Storage Class Memory including a direct attached dual in line memory (DIMM) card, for example, containing dynamic random access memory (DRAM), Phase Change Memory (PCM), Resistive RAM (ReRAM), Spin-Transfer-Torque RAM (STT-RAM), and NAND Flash chips.

Having reference now to the drawings, in FIG. 1, there is shown an example solid-state storage system generally designated by the reference character 100 for implementing enhanced solid-state Storage Class Memory in accordance with an embodiment of the invention. Solid-state storage system 100 includes solid-state storage devices contained on a direct attached dual in line memory (DIMM) card 102. Enhanced solid-state Storage Class Memory (eSCM) system 100 enables a low power, low cost, large memory space, for example, a memory space in hundreds of GBs.

Enhanced solid-state Storage Class Memory (eSCM) system 100, for example, includes volatile data storage dynamic random access memory (DRAM) 104, and non-volatile data storage devices including Phase-Change-Memory (PCM) 105, Resistive RAM (ReRAM) 106, Spin-Transfer-Torque RAM (STT-RAM) 107 and NAND Flash memory 108 contained on the DIMM card 102. An eSCM processing unit 110, such as an embedded processing unit, is provided with the DRAM 104, PCM 105, ReRAM 106, STT-RAM 107, and NAND Flash memory 108 on the DIMM card 102. The eSCM processing unit or eSCM controller 110 selectively moves data among the DRAM 104, PCM 105, ReRAM 106, STT-RAM 107, and NAND Flash memory 108 enabling enhanced latency and throughput performance. eSCM system 100 includes control code 112 for implementing smart decision algorithms for data set activity detection and categorization. eSCM system 100 includes memory electrical interface circuits 114 coupled to the eSCM processor unit 110.

Figure 2A:
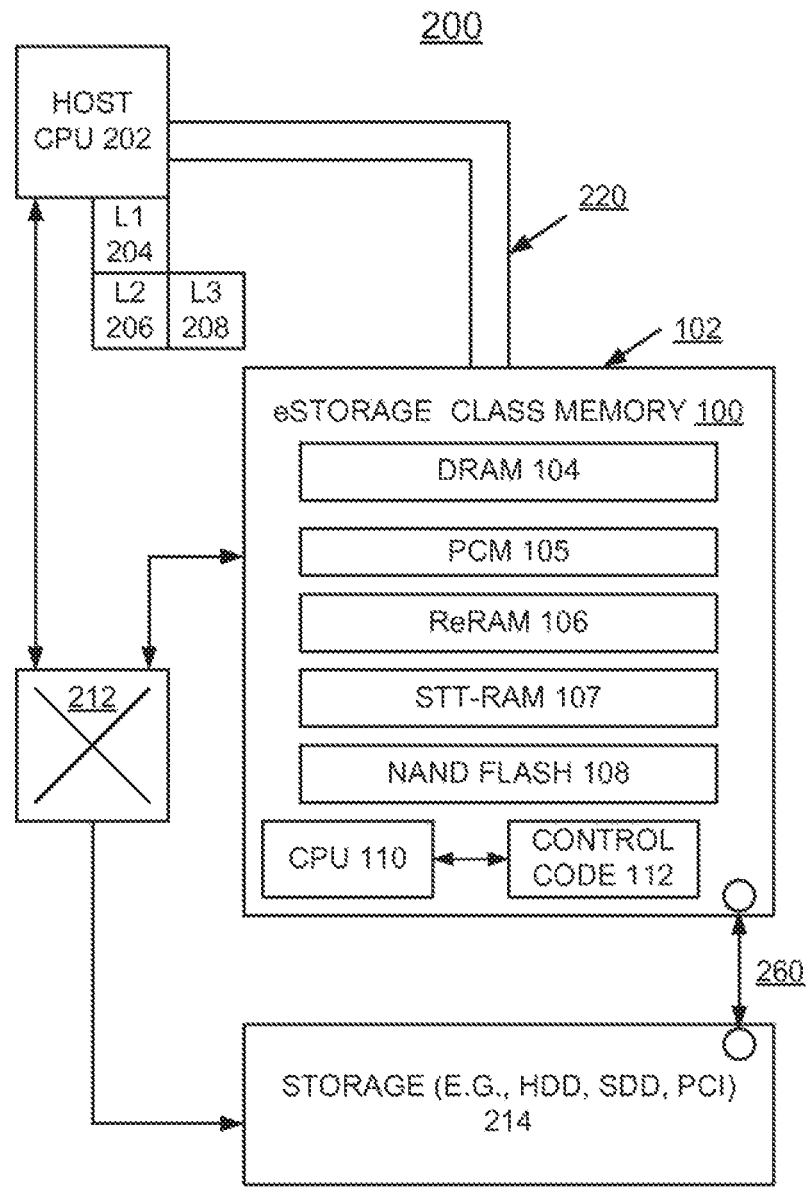
FIG. 2A is a block diagram representation of a computer system including the enhanced solid-state Storage Class Memory of FIG. 1 in accordance with an embodiment of the invention.

Referring also to FIG. 2A, there is shown an example processor or computer system including the eSCM system 100 of FIG. 1 in accordance with an embodiment of the invention. System 200 includes a central processor unit (CPU) 202 and a plurality of cache memory L1, 204, L2, 206, L3, 208. System 200 includes a memory controller 212, and storage 214, such as, a Direct Access Storage Devices (DASD), such as Solid State Drive (SSD), or Hard Disk Drive (HDD) including a Shingled Disk Drive (SDD), or a Peripheral Component Interconnect (PCI) computer bus for attaching hardware devices (not shown) in the system 200. For generality purposes, CPU 202 is depicted as also connected to the eSCM 100 by an interface 220, such as a system bus 220. In system 200, hierarchy of DRAM 104 is encompassed by the eSCM 100 and management of data movements among the hybrid collection of solid state memory technologies present in the eSCM 100 is driven by specific algorithms housed in the eSCM processor 110 itself, for example, as described below. eSCM 100 has an interface 260 without interference of the host CPU 202. Those skilled in the art will recognize that the eSCM capability to transfer data between eSCM 100 and storage 214 without the host CPUs intervention.

Figure 2B:
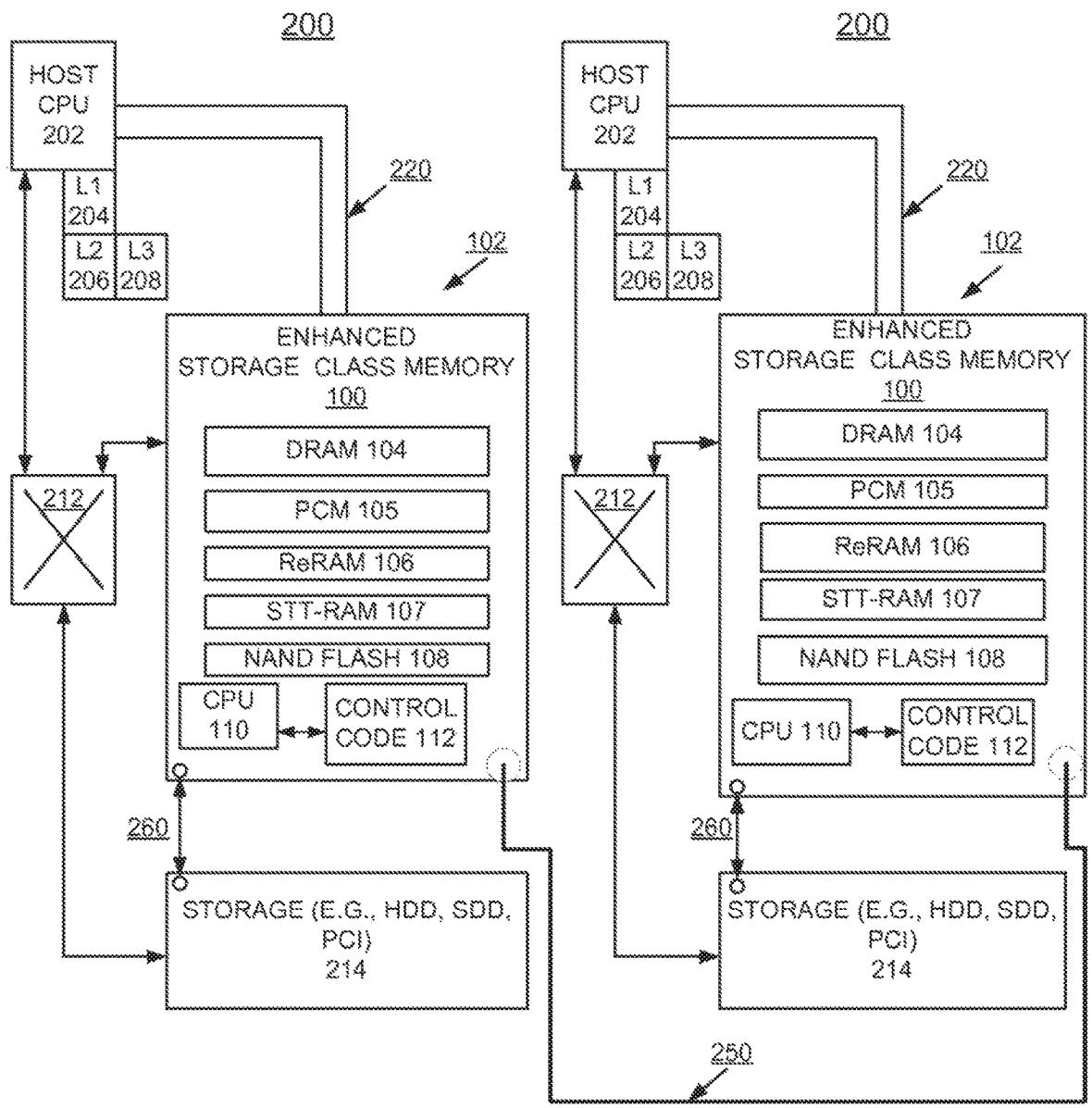
FIG. 2B is a block diagram representation of computer systems, each including the enhanced solid-state Storage Class Memory of FIG. 1 in accordance with an embodiment of the invention where the SCM in the different computer system are capable of exchange data without interference of the host CPU and this embodiment supports cloud applications.

Referring also to FIG. 2B, there is shown an example pair of computer systems 200 of FIG. 2A, each including the enhanced Storage Class Memory 100 of FIG. 1 in accordance with an embodiment of the invention where the eSCM 100 in the different computer systems 200 are capable of exchange data as indicated at an interface 250 without interference of the host CPU 202. Those skilled in the art will recognize that the eSCM capability to transfer data between computer systems without the host CPUs intervention can be extended to many more than two computer systems and be the used to support efficient data movement for a large assembly of computer systems as used in cloud applications.

In accordance with features of the embodiments of the invention, eSCM processor 110 communicates with the memory controller or CPU 202 as a standard main memory DRAM module in the Dual Inline Memory Module (DIMM) socket. The memory bus 220 can be standard DRAM bus with 240 lines or narrower high speed Fully-Buffered DRAM bus. In both cases all signals in the bus are routed to the eSCM processor 110, which will according to predefined algorithms decide to commit the data to DRAM 104, PCM 105, ReRAM 106, STT-RAM 107, or NAND Flash 108.

It should be understood that principles of the present invention are not limited to a particular bus arrangement, and many other bus configurations are possible without departing from the spirit of this invention.

In accordance with features of the embodiments of the invention, control code 112 enables eSCM processor 110 of the eSCM system 100 to use its own intelligent data detection algorithms to determine when data should be committed to DRAM 104, PCM 105 or NAND Flash 108. Optionally, the eSCM processor 110 can coordinate with the host CPU 202 and learn from this CPU 202 specific data requirements that recommend a particular data set to be committed to one of the technologies or memory tier available of DRAM 104, PCM 105, ReRAM 106, STT-RAM 107, or NAND Flash 108.

In accordance with features of the embodiments of the invention, in another innovation, data sets are committed to the different solid state memory technologies according to data set sizes. It is a departure from typical hierarchical memory concepts where data is committed to different memory (or storage) hierarchy according to frequency of reuse and spatial and location proximity correlation. Memory control code 112 of the eSCM system 100 allows for coordination, detection and categorization of features with host CPU 202. For example, control code 112 of the invention optionally allows the CPU 202 of the host system 200 to determine the sizes of DRAM 104 for cache or for write buffer, what data set should be immediately committed to PCM 105 or NAND Flash 108, and what addresses should be fetched directly from PCM 105 or NAND Flash 108 in a read operation, among combination of these features.

eSCM system 100 and system 200 are shown in simplified form sufficient for understanding the present invention. It should be understood that principles of the present invention are not limited to the illustrated eSCM system 100 and the illustrated system 200. The illustrated system 200 is not intended to imply architectural or functional limitations. The present invention can be used with various hardware implementations and systems and various other internal hardware devices in accordance with an embodiment of the invention.

In accordance with features of the embodiments of the invention, the eSCM processor 110 selectively moves data among the DRAM 104, PCM 105, ReRAM 106, STT-RAM 107, and NAND Flash memory 108 enabling enhanced latency and throughput performance. Using the three technology direct attached DIMM card 102, for example, including DRAM 104, PCM 105 and NAND Flash 108 of the invention provides enhanced latency and throughput performance as compared to the latency incurred if a large data set were to be only available in storage 214, such as HDD or SSD. eSCM 100 is a low latency storage, which has main memory class.

In accordance with features of the embodiments of the invention, the cost of the eSCM system 100 is diminished by extensive use of low cost NAND Flash memory 108. Low power is achieved by both extensively use of non-volatile memory space including PCM 105 and NAND Flash memory 108 and selective power down of unused memory chips including DRAM 104. An extremely large memory space advantageously is defined by PCM 105 and NAND Flash 108 enabling DRAM tier 104 to work more as a write buffer than as a cache for both other tiers. Data in a read operation can be retrieved directly from PCM 105 or NAND Flash 108, when not available in DRAM 104. Hence, in an embodiment, there could be only one copy of the data in the eSCM 100; hence none of the solid state technologies is used as cache.

Figure 3A:
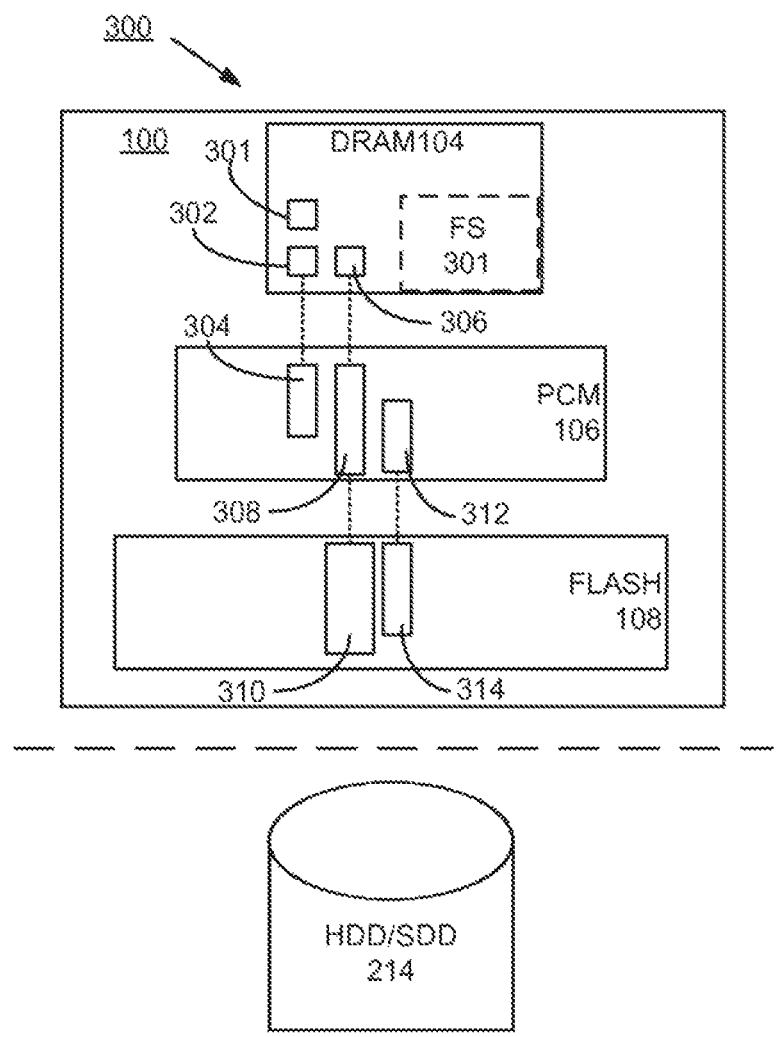
FIGS. 3A, and 3B schematically illustrates example data location based on data set sizes of the enhanced solid-state Storage Class Memory of FIG. 1 and HDD/SSD of FIG. 2 for implementing enhanced solid-state storage usage performance in accordance with an embodiment of the invention.

Referring to FIG. 3A, in another innovation in this invention, example operations generally designated by the reference character 300 of the eSCM 100, including straddling data sets across different memory technologies. In FIG. 3A, the eSCM 100 is shown together with the storage 214 of system 200. In FIG. 3A, the example data locations based on data set sizes are illustrated with DRAM 104, PCM 105 and NAND Flash 108 of the of the eSCM 100. Smaller data sets, as in a first data set indicated by 301, are completely placed in DRAM. Progressive larger data set, which are expected to be later read as a single set, are stored completely on other solid state memory technologies or stored across different solid state memory technologies. A second data set indicated by 302, 304 is respectively stored in the DRAM 104 and PCM 105. That is, the second data set 302, 304 has part of its data stored in DRAM 104 and part of its data stored in PCM 105; hence this is a data set that straddles along two different solid state memory technologies. A third data set indicated by 306, 308, 310 is respectively stored part in the DRAM 104, part in PCM 105 and part in NAND Flash 108. A fourth data set indicated by 312, 314 is respectively stored part in the PCM 105 and part in NAND Flash 108.

Figure 3B:
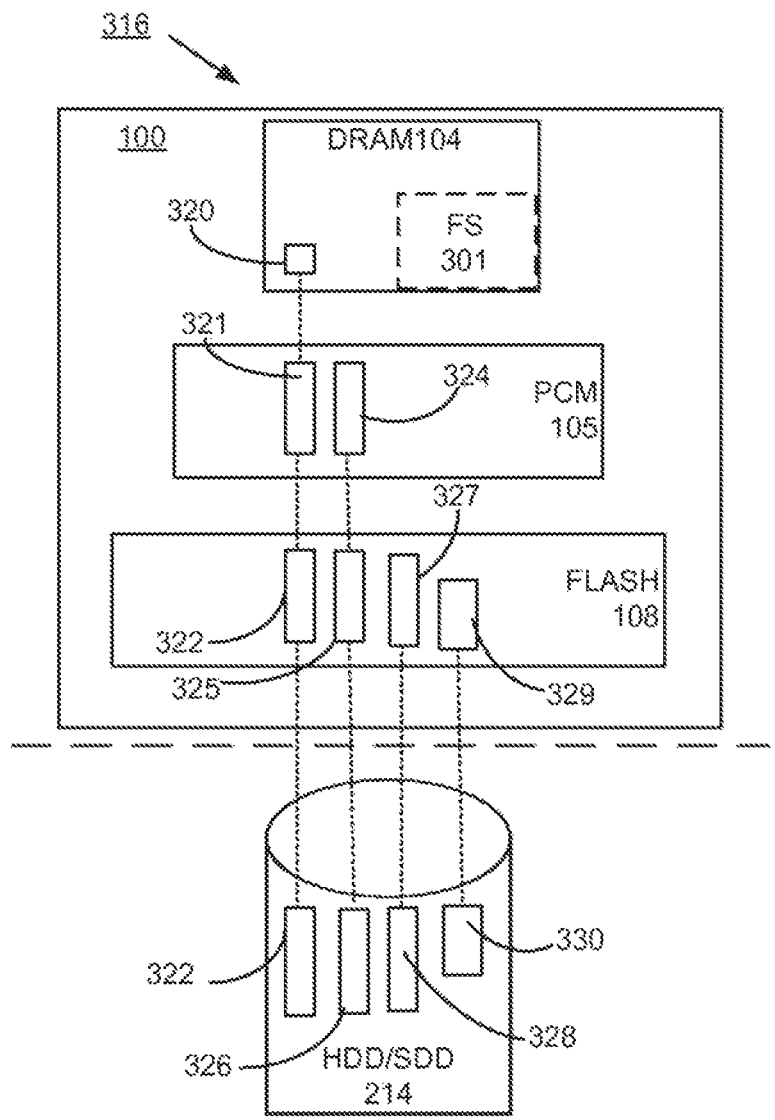

Referring also to FIG. 3B, in another innovation in this invention, example operations generally designated by the reference character 318 of the eSCM 100, including straddling data sets across different memory technologies of the eSCM 100 and the HDD/SSD 214 of system 200. A fifth data set indicated by 320, 321, 322, 323 is respectively stored part in DRAM 104, part in PCM 106, part in NAND Flash 108 and part in HDD/SSD 214. A sixth data set indicated by 324, 325, 326 is respectively stored part in PCM 106, part in NAND Flash 108 and part in HDD/SSD 214. A seventh data set indicated by 327, 328 is respectively stored part in NAND Flash 108 and part in HDD/SSD 214. A further data set indicated by 329 is stored in the NAND Flash 108 and data set indicated by 330 is stored in the HDD/SSD 214. It should be understood that this innovation will be used to support another innovation in this invention, where the higher read latency of a given solid state memory technology is partially or completely hidden by the operation of another solid state memory technology with lower read latency.

Figure 4C:
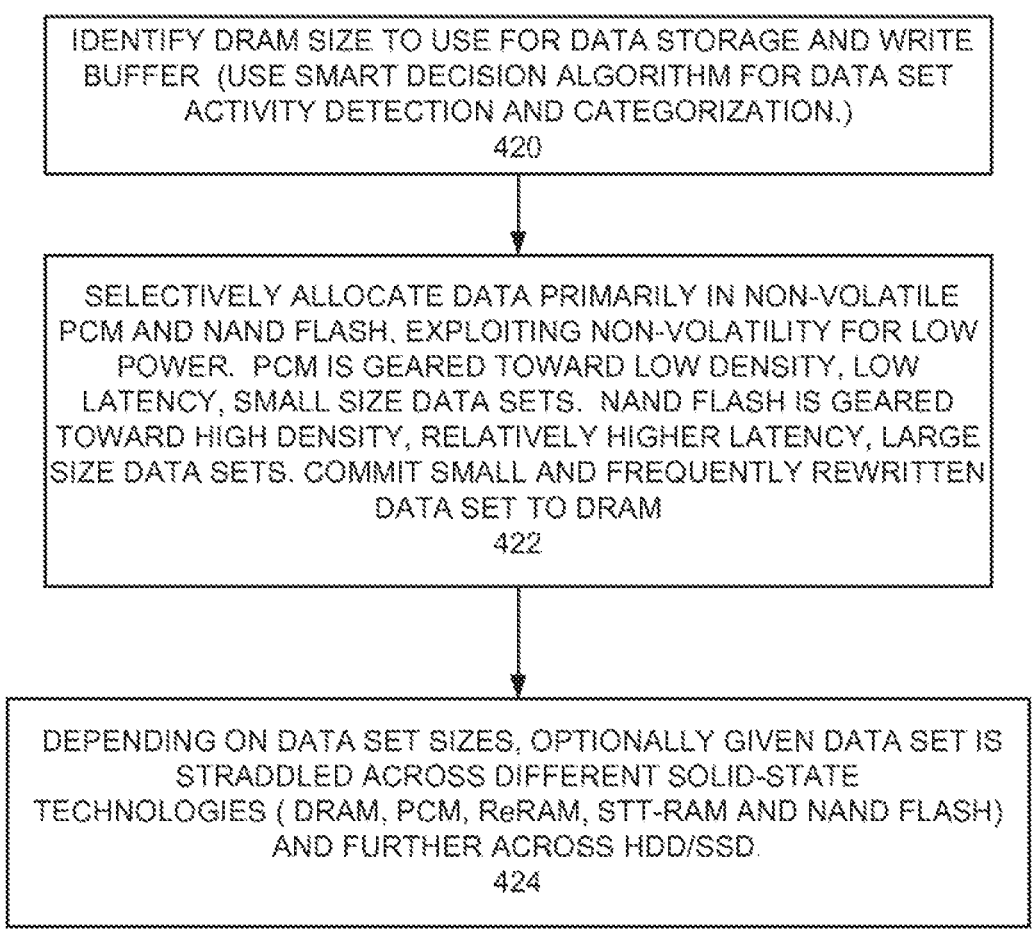

Referring now to FIGS. 4A, 4B, 4C are flow charts illustrating example operations of the eSCM 100 for implementing enhanced solid-state storage usage performance in accordance with embodiments of the invention.

In FIG. 4A, example operations, for example, performed by CPU 110, start as indicated at a block 400. eSCM CPU or eSCM controller 110 performs workload recognition and presents only a memory interface to the computer system 200 as indicated at a block 402, which allows not only complete software compatibility but also complete hardware compatibility with computer systems using only DRAM. Hence, existing DIMMs in substantially all existing systems can be swapped out for the new eSCM 100 in accordance with embodiments of the invention. As indicated at a block 404, eSCM controller 110 selectively moves data among DRAM 104, PCM 105, ReRAM 106, STT-RAM 107, and NAND Flash 108 with data types used to achieve improved latency, and throughput performance characteristics.

In FIG. 4B, example operations, for example, performed by eSCM controller 110 continue with writing data to the NAND Flash 108 and never are initial writes to PCM 105, with all writes buffered in DRAM and sent to the NAND Flash as indicated at a block 410 in accordance with embodiments of the invention. This strategy exploits both the lower write process time in NAND Flash as opposed to PCM, and also the possibility of a design decision to further parallelize access to the much larger capacity available in NAND Flash relative to PCM in an embodiment of this invention. As indicated at a block 412, data is selectively migrated among DRAM 104, PCM 105, ReRAM 106, STT-RAM 107, and NAND Flash 108 according to data set sizes. As indicated at a block 414, reads retrieve data from any of the memory technologies including DRAM 104, PCM 105, ReRAM 106, STT-RAM 107, and NAND Flash 108. This is another detail that indicates none of these solid state memory technologies are being used as cache of another in an embodiment of the invention. Nevertheless, those skilled in the art will readily recognize that adding a cache strategy in addition to the strategies described in this invention is straightforward without departing from the spirit of this invention.

In FIG. 4C, example operations, for example, performed by eSCM controller 110 include identifying DRAM size to use for data storage and write buffer, a smart decision algorithm is used for data set activity detection and categorization as indicated at a block 420. As indicated at a block 422 data is selectively allocated primarily in non-volatile PCM 105, and NAND Flash 108, exploiting non-volatility for low power instead of refreshing large DRAM sets. PCM 105 by array design is geared toward low density, low latency, and smaller sized data sets. NAND Flash 108 by array design is geared toward high density, relatively higher latency, and larger sized data sets. The smaller data sets with high frequency of writes are preferably committed to DRAM 104 itself, from which they can be retrieved with minimal latency.

Another important innovation, as indicated at a block 424, depending on data set sizes optionally a given data set is straddled across different solid-state technologies including DRAM 104, PCM 105, ReRAM 106, STT-RAM 107, and NAND Flash 108, and optionally further across HDD/SSD 204. This allows for hiding latencies of PCM 105 or NAND Flash 108 in some data sets as detailed below.

Figure 5:
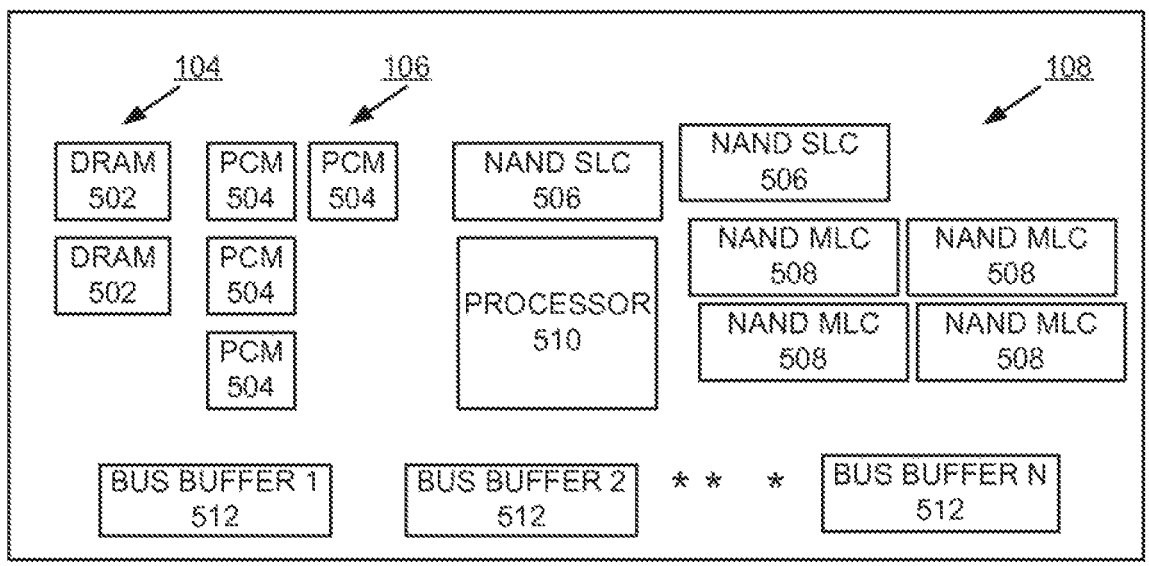
FIG. 5 schematically illustrates another more detailed example enhanced solid-state Storage Class Memory for implementing enhanced solid-state storage performance in accordance with embodiments of the invention.

Referring now to FIG. 5, there is schematically shown another more detailed example solid-state storage system generally designated by the reference character 500 for implementing enhanced solid-state enhanced Storage Class Memory (eSCM) in accordance with embodiments of the invention. In the example eSCM 500, ReRAM, and STT-RAM are not shown. In this embodiment, NAND Flash is further partitioned in Single-Level Cell (SLC) and Multi-Level Cell (MLC) technologies. Thus, solid state enhanced Storage Class Memory (eSCM) system 500 includes DRAM 104 including DRAM chips 502, PCM 105 including PCM chips 504, and NAND Flash 108 including a combination of NAND Flash Single-Level Cell (SLC) chips 506 and NAND Flash Multi-Level Cell (MLC) chips 508. Solid-state storage system eSCM 500 includes a processor 510 and a plurality of bus buffers 1-N, 512, together with the DRAM chips 502, PCM chips 504, and NAND Flash SLC chips 506 and NAND Flash MLC chips 508.

In accordance with features of the embodiments of the invention, bandwidth is handled by eSCM processor 510 by buffering and parallelization, using bus buffers 1-N, 512 with the DRAM chips 502, PCM chips 504, and NAND Flash SLC chips 506 and NAND Flash MLC chips 508.

Figure 6A:
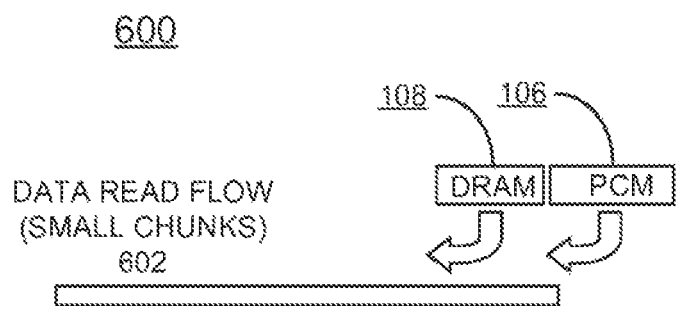
FIGS. 6A, 6B, 6C are charts schematically illustrating example operations of the enhanced solid-state Storage Class Memory of FIG. 1 for implementing a process of latency hiding in a Storage Class Memory in accordance with embodiments of the invention.
Figure 6B:
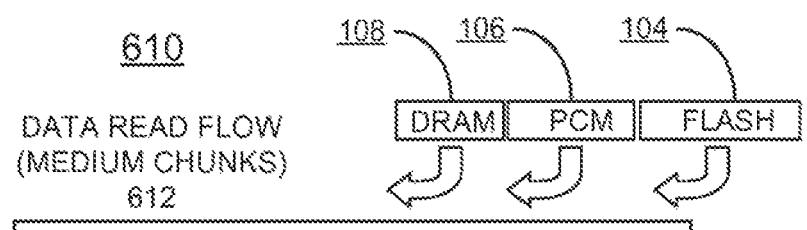
Figure 6C:
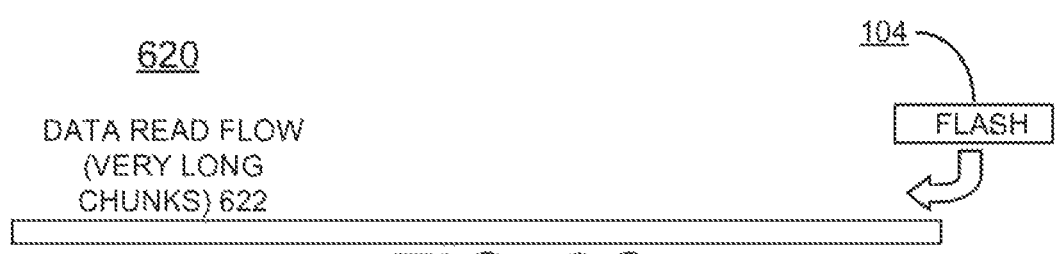

Recalling that according to size, data sets can straddle different solid state memory technologies, latency from one solid state memory technology can be hidden or partially hidden by another lower latency solid state technology. Referring now to FIGS. 6A, 6B, 6C charts are shown schematically illustrating example read operations of the eSCM system 100 or solid-state storage system eSCM 500 for implementing enhanced solid-state storage usage performance in accordance with embodiments of the invention. As described above to implement enhanced solid-state storage latency performance, data is migrated among DRAM 108, PCM 105 and NAND Flash 104 and DRAM chips 502, PCM chips 504, and NAND Flash SLC chips 506 and NAND Flash MLC chips 508 depending on data set sizes.

In FIG. 6A, example read operations generally designated by the reference character 600, for example performed by eSCM controller 110, with data read flow 602 of small chunks from DRAM 104 and PCM 105. For example, small requests are sometimes as small as 32 B or 64 B, but average main memory accesses tend to get chunks of 16 KB average. In this example, a data set straddling DRAM 104 and PCM 105 technologies is to be read. The SCM responds to the read request by sending first the part of the data requested which resides in DRAM 104. In parallel, and hidden from the host, the SCM starts fetching the remaining data from PCM 105. Hence, the latency from the PCM 105 technology is hidden or partially hidden by the latency in DRAM 104 access and the time taken to transfer that data from DRAM 104 to the host 202. Depending on the size of the partitions of the data set in DRAM 104 and PCM 105, the latency of these two technologies and the speed of the bus, the higher latency from the PCM access can be completely hidden and unnoticed by the host 202. Hence, this solution behaves as if all the data set were in DRAM, but the cost of this solution will be proportionally lowered by the relative amount of PCM and DRAM. Moreover, in an event of a power loss, only the part of the data residing in DRAM needs to be saved to a non-volatile memory in the eSCM.

In FIG. 6B, example read operations generally designated by the reference character 610, for example performed by eSCM controller 110, with data read flow 612 of medium sized chunks from DRAM 108, PCM 105 and NAND Flash 104. In this case the data set is large enough to straddle three different technologies. As part of the data is sequentially read and sent to the host from the lowest latency memory technologies, data from the remaining memory technologies also requested is being fetched. Depending on the size of the partitions of the requested data set allocated to each of the memory technologies, the actual latencies of the different solid state memory technologies, and the speed of the bus, the latency from the PCM 105 and NAND Flash 108 accesses can be completely hidden and unnoticed by the host.

Those skilled in the art will readily recognize other memory technologies can be used in the eSCM and benefit from the same invention described here. Those skilled in the art will also recognize that the size of the data set partitions in each memory technology the data set straddles is a function of the actual latencies of the solid state memory technologies used and the speed of the bus. In an embodiment, careful design might offer partial or total hidden latencies according to how critical a data set is.

In FIG. 6C, example read operations generally designated by the reference character 620, for example performed by eSCM controller 110, with data read flow 622 of very long chunks from NAND Flash 108. For example, any request for more than 320 KB will allow NAND Flash 108 to engage reading. In such a very large size data set, the latency from NAND Flash 108 may itself be of less importance, and the SCM could allocate the entire data set in NAND Flash 108.

Those skilled in the art will readily recognize that the strategy of allocating data primarily according to data set size can be used in conjunction with ancillary strategies for the case where a large amount of data of a particular size might not fit the memory space available at a particular solid state memory technology. In such a case, a secondary criteria based on frequency of use of a data set can be used to decide which data set will be placed in total or in part (in case it straddles more than one solid state technology) in the lower latency position in the storage.

Those skilled in the art will readily recognize that the strategy of allocating data of the invention includes that a given data set optionally is straddled across different solid-state technologies including DRAM 104, PCM 105, ReRAM 106, STT-RAM 107, and NAND Flash 108, and optionally further across HDD/SSD 204.

While the present invention has been described with reference to the details of the embodiments of the invention shown in the drawing, these details are not intended to limit the scope of the invention as claimed in the appended claims.

The invention claimed is:

1. An apparatus, comprising:
   a direct access storage device (DASD);
   a direct attached dual in line memory (DIMM) card, wherein the DIMM card is separate from the storage; wherein the DIMM card includes:
      at least one memory unit of dynamic random access memory;
      at least one nonvolatile memory including:
         a NAND flash memory,
         a resistive RAM memory,
         a spin transfer torque RAM memory, and
         Phase Change memory (PCM);
      at least one processing unit;
      a memory containing a control code for access by the at least one processing unit;
      at least one memory electrical interface circuit; and
      at least one enhanced storage class memory (eSCM) interface configured to interface with the DASD; and
   an eSCM controller coupled to both the DASD and the DIMM card and configured to control operations of the at least one nonvolatile memory, and wherein the apparatus is configured to transfer data between the DASD and the DIMM, and within the at least one nonvolatile memory without a host CPU intervention, wherein the eSCM controller is configured to continue to write data to the NAND flash memory, wherein the data is selectively migrated among the PCM, the resistive RAM memory, and the spin transfer torque RAM memory, wherein the eSCM is configured to straddle data sets across the DASD and the at least one nonvolatile memory, and wherein the data sets are expected to be read as a single set.

2. The apparatus according to claim 1, further comprising: at least one bus interface.

3. The apparatus according to claim 2, wherein the bus interface is configured as one of a standard dynamic random access memory bus and a fully-buffered dynamic random access memory bus.

4. The apparatus according to claim 1, wherein the at least one processing unit is configured to determine when data should be stored in dynamic random access memory, phase-change memory, resistive random access memory, spin-transfer-torque ram memory and NAND flash memory.

5. The apparatus according to claim 1, wherein the at least one processing unit is configured to determine when data should be stored in dynamic random access memory, phase-change memory, resistive random access memory, spin-transfer-torque ram memory and NAND flash memory based on a size of a data set.

6. A method for operating a direct attached dual in line memory (DIMM) card, comprising:
   buffering a set of data in a dynamic random access memory;
   writing the set of data into a NAND flash memory; and
   selectively migrating the set of data from the NAND flash memory to phase change memory, resistive random access memory, and spin-torque transfer random access memory based on a size of the set of data through an enhanced storage class memory (eSCM) controller configured to control operations of a storage class memory, wherein the set of data is transferred through at least one eSCM interface configured to interface with both the direct attached dual in line memory (DIMM) card and a direct access storage device (DASD) without interference from a host, wherein the eSCM controller is configured to continue to write data to the NAND flash memory, wherein the data is selectively migrated among the phase change memory, the resistive random access memory, and the spin transfer torque random access memory, wherein the eSCM is configured to straddle data sets across the DASD and the DIMM, and wherein the data sets are expected to be read as a single set.

7. The method according to claim 6, further comprising: reading data from at least one of the dynamic random access memory, a phase-change memory, a resistive random access memory, a spin-torque transfer random access memory and the NAND flash memory.

* * * * *